United States Patent [19]
Feldman

[11] Patent Number: 5,712,766
[45] Date of Patent: Jan. 27, 1998

[54] ONE-PIECE HOUSING AND INTERLOCKING CONNECTOR FOR IC CARD ASSEMBLIES

[75] Inventor: Steven Feldman, Madison, Ohio

[73] Assignee: Minnesota Mining and Manufacturing Company, St. Paul, Minn.

[21] Appl. No.: 733,375

[22] Filed: Oct. 17, 1996

[51] Int. Cl.⁶ .................................................. H05K 1/14
[52] U.S. Cl. ...................... 361/737; 361/728; 361/730; 361/736; 361/752; 361/801
[58] Field of Search ...................... 361/786, 727, 361/728, 730, 736, 737, 740, 746, 747, 684, 753, 752, 801, 816, 818; 174/52.1; 439/61, 62, 65, 609, 608; 235/380, 388, 387, 492

[56] References Cited

U.S. PATENT DOCUMENTS

| | | | |
|---|---|---|---|
| 4,531,176 | 7/1985 | Beecher, II | 361/816 |
| 5,017,767 | 5/1991 | Mizuno | 235/492 |
| 5,313,364 | 5/1994 | Omori et al. | 361/736 |
| 5,337,220 | 8/1994 | Granitz | 361/816 |
| 5,397,857 | 3/1995 | Farquhar et al. | 174/52.1 |
| 5,414,253 | 5/1995 | Bandouin et al. | 235/492 |
| 5,430,618 | 7/1995 | Huang | 361/816 |
| 5,490,891 | 2/1996 | Farquhar et al. | 156/73.1 |
| 5,510,959 | 4/1996 | Derstine et al. | 361/816 |
| 5,541,448 | 7/1996 | Carpenter | 257/679 |
| 5,546,278 | 8/1996 | Bethurum | 361/737 |
| 5,547,397 | 8/1996 | Hirai | 439/607 |
| 5,548,483 | 8/1996 | Feldman | 361/737 |
| 5,548,484 | 8/1996 | Kantner | 361/737 |
| 5,548,485 | 8/1996 | Bethurum et al. | 361/737 |
| 5,574,628 | 11/1996 | Persia et al. | 361/737 |

FOREIGN PATENT DOCUMENTS

| | | |
|---|---|---|
| 0697806 A1 | 2/1996 | European Pat. Off. . |
| 5-201183 | of 1993 | Japan . |
| 5-201184 | of 1993 | Japan . |
| 08 096871 A | 8/1996 | Japan .................. H01R 9/09 |

*Primary Examiner*—Leo P. Picard
*Assistant Examiner*—Anthony Dinkins
*Attorney, Agent, or Firm*—Gary L. Griswold; Walter N. Kirn; Haynes & Boone

[57] ABSTRACT

An IC card assembly includes a one piece molded housing having an open end and a cavity formed therein. The open end includes an interface having a plurality of keyed first interlock surfaces. An IC card is attached to a connector. The connector has a mating interface including second interlock surfaces keyed into oriented engagement with the keyed first interlock surfaces. Spacers are provided for maintaining spacing between the housing and opposed surfaces of the card. Interacting latch members secure the engagement of the connector and the housing.

20 Claims, 5 Drawing Sheets

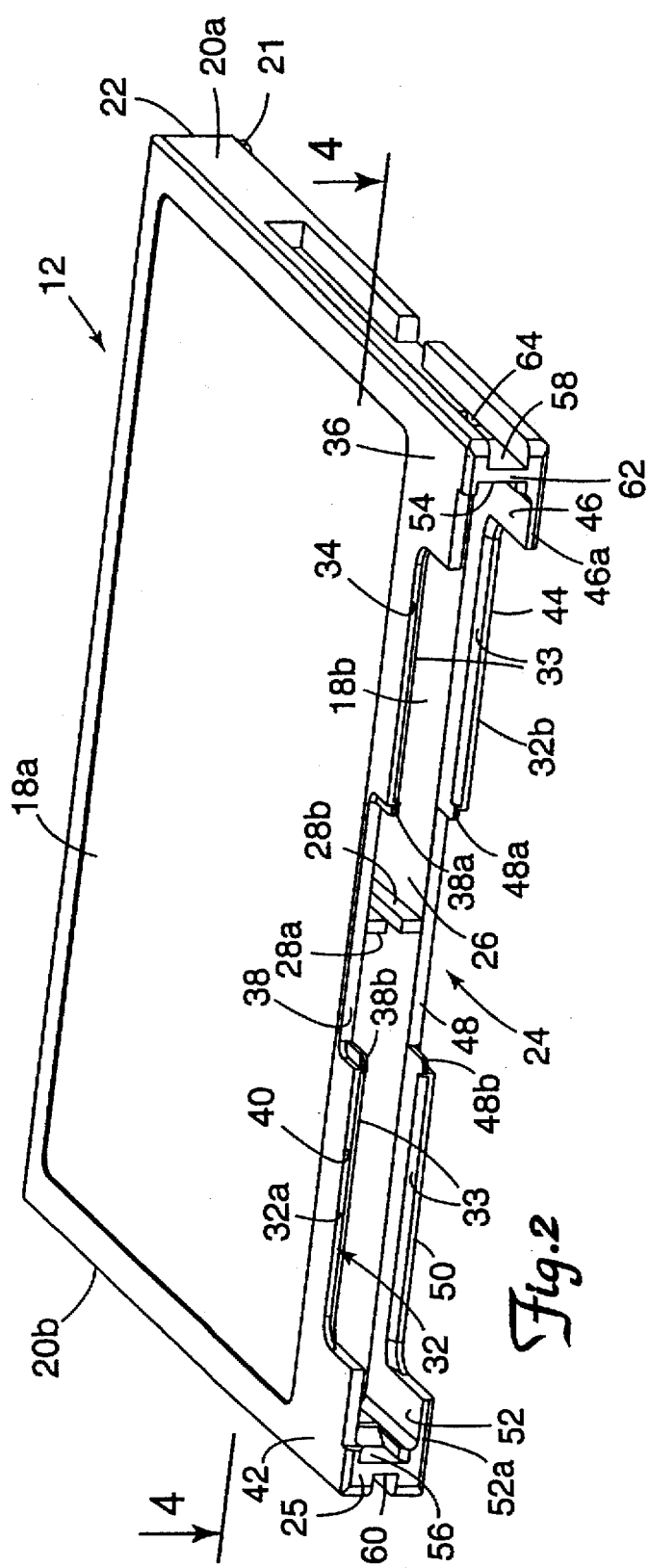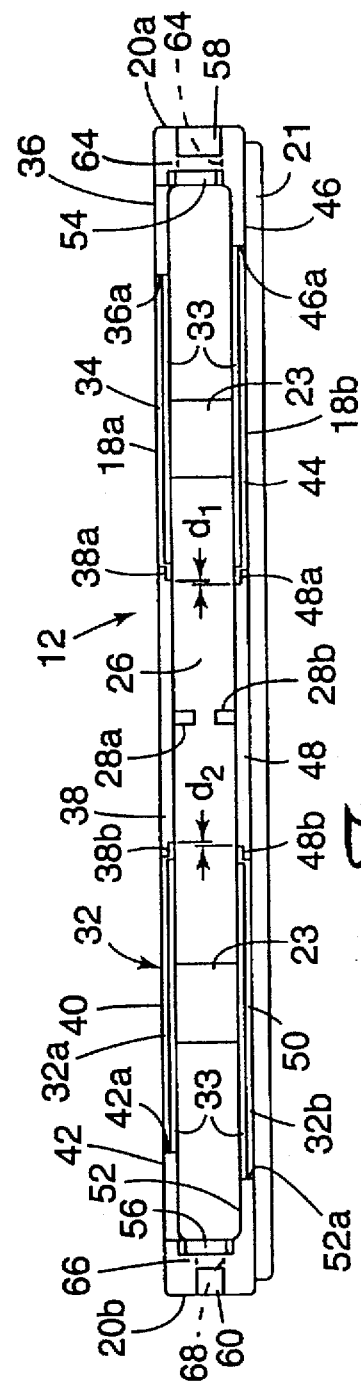

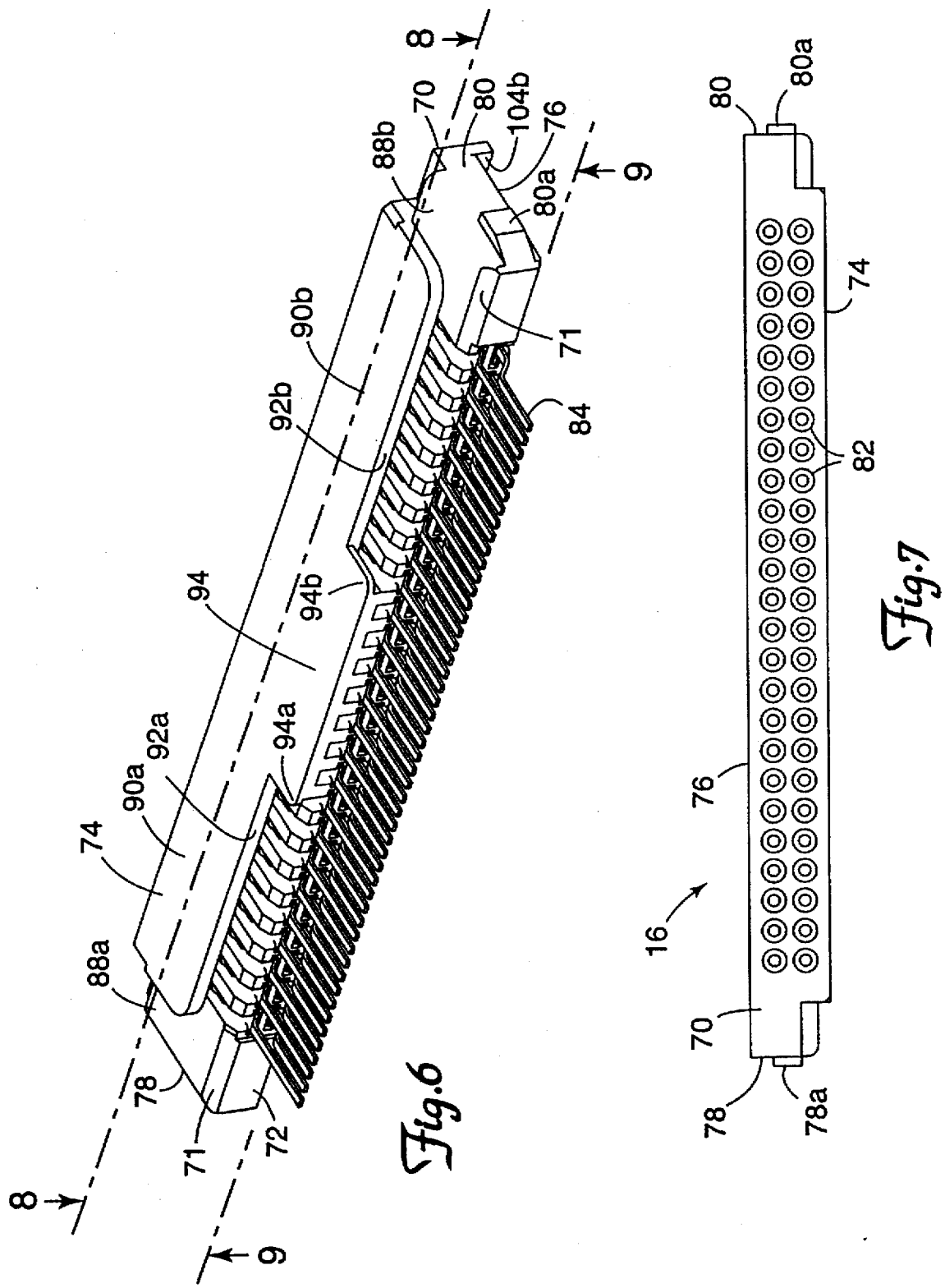

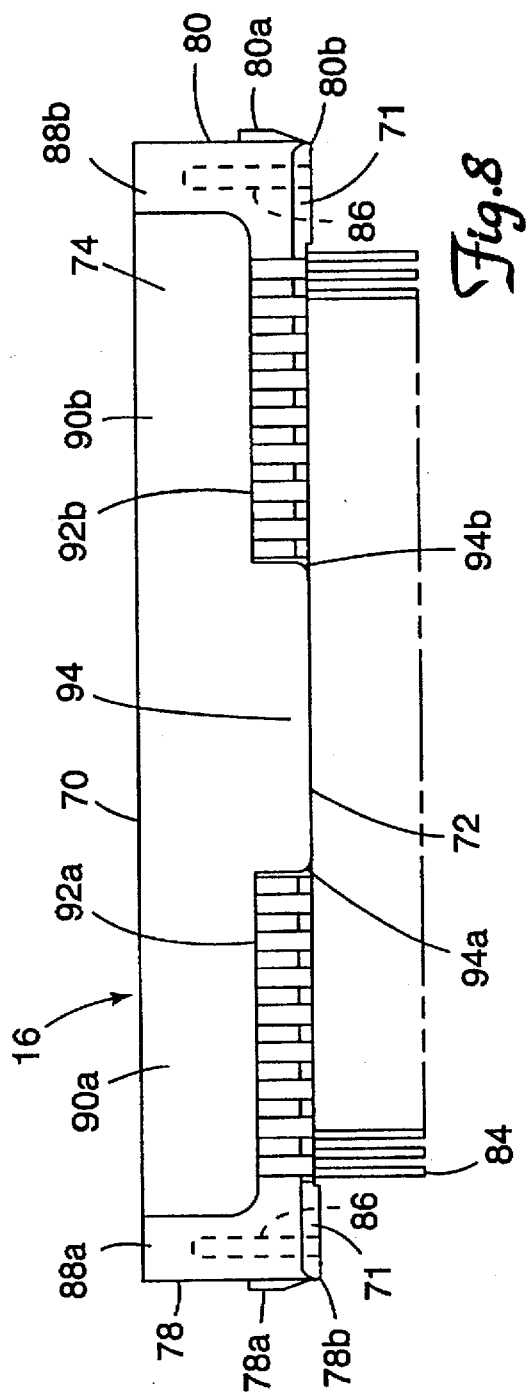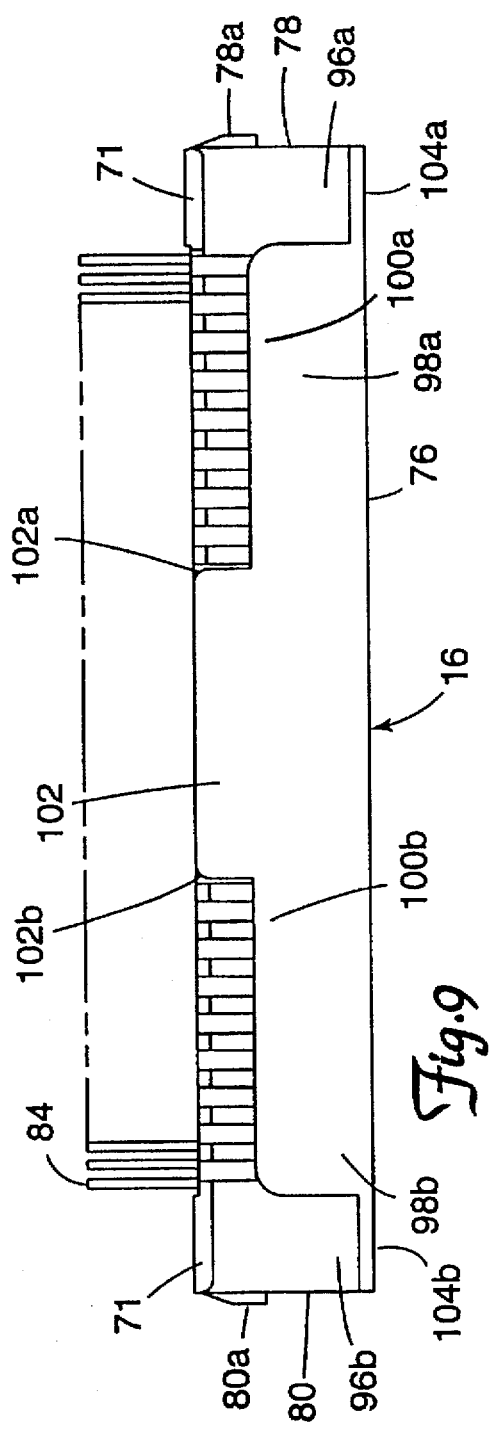

ONE-PIECE HOUSING AND INTERLOCKING CONNECTOR FOR IC CARD ASSEMBLIES

BACKGROUND OF THE INVENTION

The present invention relates generally to IC card assemblies and more particularly to providing a one-piece housing for receiving a card and an interlocking connector.

A typical IC card assembly such as Personal Computer Memory Cards, Compact Flash Cards and other electronic card structures for similar applications, are usually assembled from components commonly referred to as "Card Kits." The components generally include a plastic frame which retains a connector, supports a circuit board and is attached to upper and lower covers. The covers have been made of sheet metal in the past and more recently, they have been made of plastic.

Variations are found in which some deuce of pre-assembly has been provided by the kit manufactures. For example, one of the covers has been made integral with the frame so that only the remaining cover needs to be attached after the card is installed. Also, some structures are formed as two-piece shells, each having a cover portion and a sidewall potion which can be interlocked after the card is installed. Assembly of these deuces is a "top-down" type of assembly where the card is placed in a lower receiving cover and then the upper cover is placed over the card and the interlocking sides are adhesively bonded or ultrasonically welded. In these assemblies which have interlocking covers, interior body sidewalls require extra thickness to support the interlocks. This requirement limits the area available for the cards and therefore reduces the area available for components on the card.

Of course it is really apparent that each manufacturing step adds cost to the assembly. In addition, other limitations of past assemblies are that where metal covers be used, a sheet d insulator material is required between the card and the metal cover to limit component shorting. In assemblies using metal covers, the manufacturing process includes the requirement that covers have to be bonded to the connectors to limit their separation. Where non-insulative covers are used, ground contacts between the covers and circuit board are required. Assemblies using metal covers increase the incidence of host equipment damage and program execution errors associated with ESD (electrostatic discharge) through the metal covers. It is also known that EMI (electromagnetic interference) emissions from the card case occur when the metal covers act as an antenna. Another limitation attributed to metal covers is that they can cause wearing or skiving of a host connector due to the typically sharp edges of the covers. When this occurs, insulative debris are produced which can interfere with electrical contact interfaces.

Under stress of mechanical or thermal shock, vibration or flexure, present card assemblies can fail. Common modes of failure include fracturing of ultrasonic welds and adhesive separation. Another failure in IC cards is caused by physical shock whereby movement of the circuit assembly away from the connector body occurs, taking the associated soldered contacts with it. To help avoid this, in some cases a potting compound or filler is used to provide support to the assembly and limit relative movement between the card and the covers. Further, where disassembly is required, it is difficult to do so without damaging the circuit.

Unfortunately, a suitable solution to the problems associated with IC card assemblies related to assembly of excessive parts, bonding or welding requirements, available card size and component area, insulator requirements, electrostatic discharge, electromagnetic interference, damage to host connectors and resulting debris, fracturing and separation failures and disassembly damage, have not been satisfactorily addressed by the prior art.

Therefore, what is needed is an apparatus and a method for facilitating IC card assembly. It is also highly desirable to provide added structural integrity to limit failures and short comings associated with the use of such assemblies.

SUMMARY OF THE INVENTION

The present invention, accordingly, provides an apparatus and method for assembling an IC card package. To this end, a one-piece molded housing is provided. The housing includes means for interlocking a connector in snap-fitting engagement therewith. The interlocking means includes both the connector and housing each having complimentary keyed interfaces which matingly engage in a one-way orientation. The connector and housing also include interacting latch members.

A principal advantage of the present invention is that an IC card can be attached to the connector and the connector-card subassembly can be inserted into snap-fit engagement with the housing. This also provides for lower manufacturing costs, fewer parts and less assembly steps. This is in contrast to prior art IC card assemblies which require numerous parts and assembly steps, adhesive bonding or ultrasonic welding of parts, the use of insulators, ground contacts and potting compounds or fillers.

BRIEF DESCRIPTION OF THE DRAWING

FIG. 2 is an isometric view illustrating an embodiment of the housing according to the present invention.

FIG. 3 is a frontal view of the housing taken along the line 3—3 of FIG. 1.

FIG. 6 is an isometric view illustrating an embodiment of the connector according to the present invention.

FIG. 7 is a frontal view of the connector taken along the line 7—7 of FIG. 1.

FIG. 8 is a top view of the connector taken along the line 8—8 of FIG. 6.

FIG. 9 is a bottom view of the connector taken along the line 9—9 of FIG. 6.

DESCRIPTION OF THE PREFERRED EMBODIMENT

Figure 1:
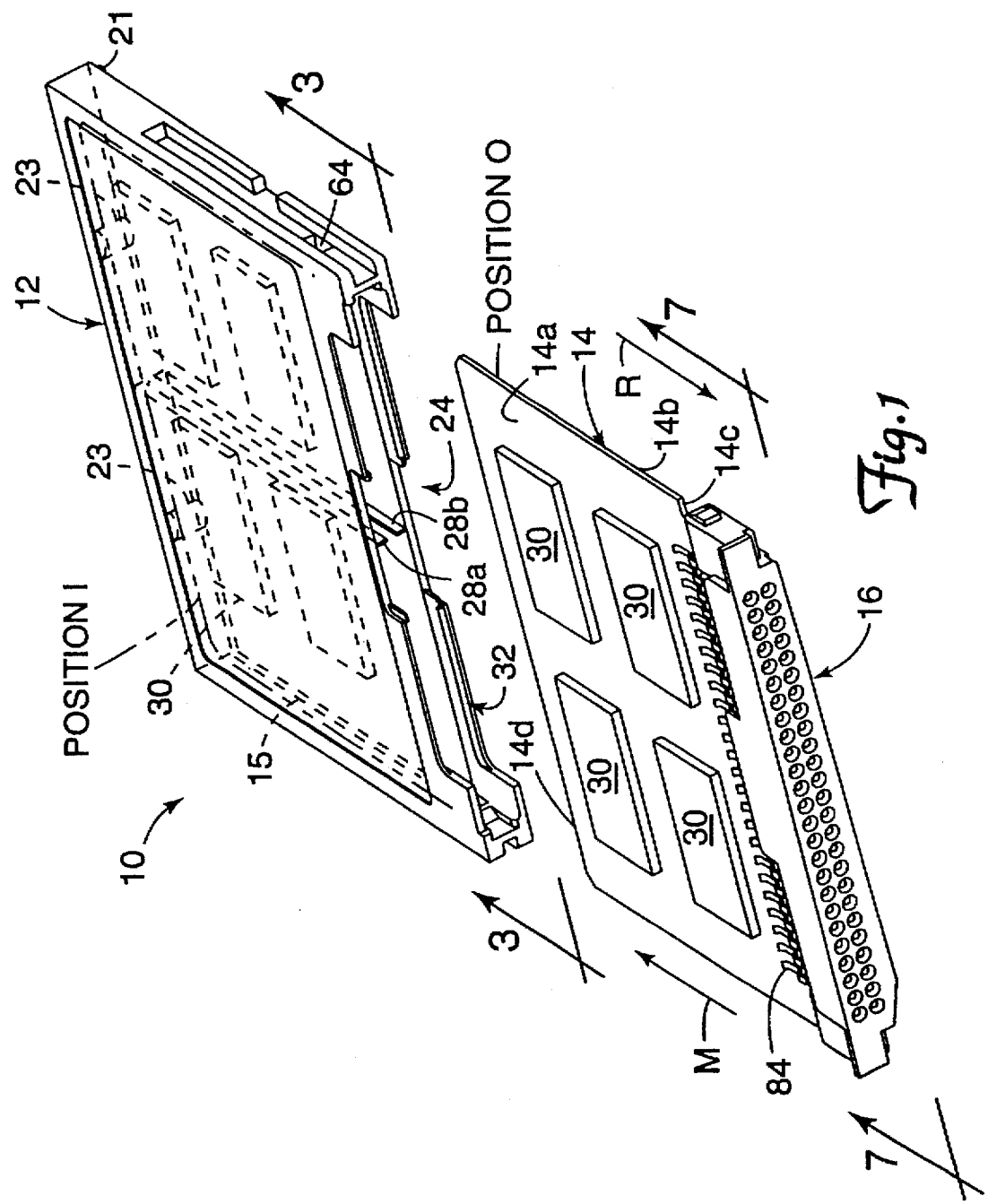
FIG. 1 is an isometric view illustrating an embodiment of an IC card assembly including a housing and a card and connector for connection therewith according to the present invention.

Referring to FIG. 1, illustrated is an isometric view of an IC card assembly generally designated 10. The assembly 10 includes a one piece molded housing 12 formed of a dielectric material, a well-known IC card 14 which can be slidably mounted into housing 12 and a connector 16 which engages card 14 and interlocks into engagement with housing 12. Card 14 includes a pair of opposed sides 14a and 14b, a connection end 14c for electrical contact with connector 16 and a plurality of components 30a mounted on surface 14a. Card 14 is inserted into housing 12 by movement from position "O", in a direction indicated by an arrow designated "M", to position "I" illustrated in phantom outline.

Housing 12, FIGS. 2 and 3, includes opposed planar walls, 18a, 18b, opposed sidewalls 20a, 20b, an end wall 22, a gripping flange 21 and a frontal surface 25 including an open end 24, thus defining a cavity 26 within housing 12. A peripheral support rail 15, is provided on opposed sidewalls 20a, 20b to support card 14 in cavity 26. A pair of elongated exemplary ribs 28a, 28b are provided in cavity 26 and extend toward open end 24. The ribs 28a and 28b are illustrated as one, 28a, being on planar wall 18a and another, 28b, being on planar wall 18b. Ribs 28a, 28b protrude toward each other from their respective walls 18a, 18b. It is to be noted however, that a varying number and location of such ribs may be provided depending on the arrangement of components on card 14. For example, as illustrated in FIG. 1, the ribs 28a, 28b are arranged so as to accommodate the arrangement of components 30 on card 14 as illustrated, but the location and number of such ribs above and below card 14 may be altered as desired to support card 14 and maintain a space between housing walls 18a, 18b and opposed respective sides 14a, 14b of card 14. The location and number of ribs 28a, 28b, above and below card 14 are not exclusively dependent on the component arrangement however. Ribs 28a, 28b are primarily provided to stiffen the opposed planar walls 18a, 18b so that these walls do not give or feel flimsy to the touch. The ribs may be arranged to contact the board components without detrimental effect. Another benefit of the ribs is that they function as flow enhancers during the molding process.

Figure 4:
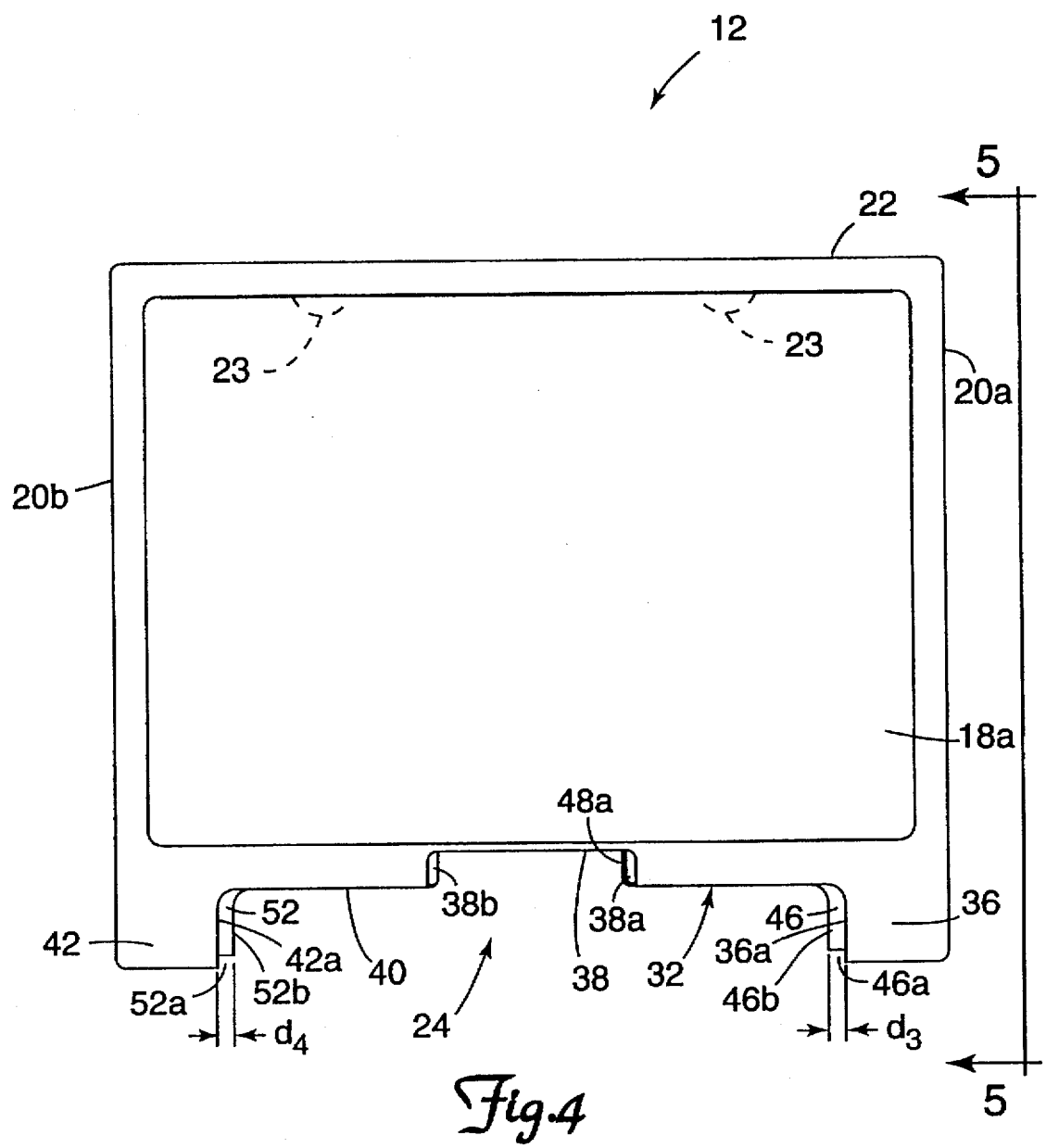
FIG. 4 is a top view of the housing taken along the line 4—4 of FIG. 2.
Figure 5:
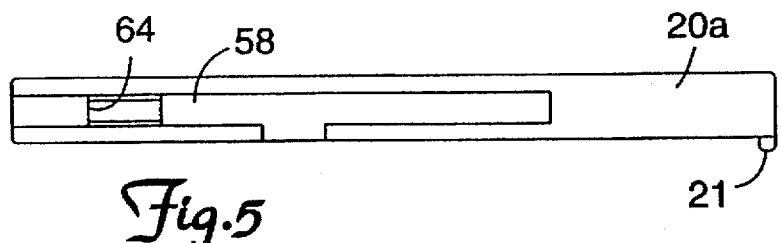
FIG. 5 is a side view of the housing taken along the line 5—5 of FIG. 4.

Open end 24, FIGS. 2, 3 and 4, includes an interface 32 having several keyed interlock surfaces defined by spaced apart surfaces 32a and 32b. Surface 32a is contoured to include reliefs. A relief 34 of surface 32a is adjacent end wall 20a and is set back from a flange 36. A relief 38 is adjacent relief 34 and is set back therefrom and further includes a pair of lips 38a, 38b. A relief 40 is adjacent side wall 20b and is set back from a flange 42. Reliefs 34 and 40 are relatively aligned.

Surface 32b is also contoured to include reliefs in a manner similar to surface 32a but offset therefrom. A relief 44 of surface 32b is adjacent wall 20a and is set back from a flange 46 which includes a cutaway 46a. A relief 48 is adjacent relief 44 and is set back therefrom and further includes a pair of lips 48a, 48b. A relief 50 is adjacent side wall 20b and is set back from a flange 52 which includes a cutaway 52a. Reliefs 44 and 50 are relatively aligned. Lips 38a and 48a are relatively laterally offset by a distance $d_1$, best shown in FIG. 3. Lips 38b and 48b are relatively laterally offset by a distance $d_2$. Also, flanges 36 and 46, FIG. 4, have respective ends 36a, 46b which are laterally offset by a distance $d_3$ as well as flanges 42, 52 which have respective ends 42a, 52b being laterally offset by a distance $d_4$.

A latch groove 54 adjacent side wall 20a and a latch groove 56 adjacent side wall 20b, see FIGS. 2 and 3, extend into cavity 26. An outer groove 58 extends along side wall 20a and a similar outer groove 60 extends along side wall 20b. Grooves 54 and 58 are separated by a wall 62. A latch receiving opening 64 in wall 62 communicates latch groove 54 and outer groove 58. Grooves 56 and 60 are separated by a wall 66. A latch receiving opening 68 in wall 66 communicates latch groove 56 and outer groove 60.

Connector 16, FIGS. 6–9 includes a frontal surface 70, a rear surface 72, a pair of spaced apart connector surfaces including an upper surface 74 and a lower surface 76, and a pair of opposed side surfaces 78, 80. Frontal surface 70 includes a plurality of pin connections 82, well known in the art, for connection to an external host connector device. Rear surface 72 includes a plurality of contact surfaces 84 for making electrical contact with connection end 14c of card 14. Side surfaces 78, 80 include a pair of latch tabs 78a, 80a, respectively. Alternatively, the latch tabs 78a, 80a may be flexibly attached to connector 16 by forming a groove 86, illustrated in phantom in FIG. 8, adjacent ends 78, 80 which results in latch tabs 78a, 80a being cantilevered on associated extensions 78b, 80b and permits lateral flexure of tabs 78a, 80a relative to connector 16. Board stops 23, FIGS. 1 and 4, are provided on a rear wall 22 of cavity 26. The purpose of board stops 23 is to limit card 14 from dislodging contacts 84 from the connector housing 16 either as a result of impact or otherwise. Board stops 23 are positioned to engage an edge 14d of card 14 and can be varied in size to accommodate various sizes of card 14.

Upper surface 74, FIGS. 6 and 8, is contoured to include a pair of spaced apart end portions 88a, 88b, a pair of spaced apart tabs 90a, 90b, which include aligned surfaces 92a, 92b, respectively and a prominent tab 94 which includes lips 94a, 94b. Lower surface 76, FIGS. 6 and 9, is contoured to include a pair of spaced apart end portions 96a, 96b, a pair of spaced apart tabs 98a, 98b which include aligned surfaces 100a, 100b, respectively, and a prominent tab 102 which includes lips 102a, 102b. Lower surface 76 also includes a pair of spaced apart flanges 104a, 104b, one, 104a, being adjacent side surface 78, the other, 104b, being adjacent side surface 80. The enlarged areas of the prominent tabs 94, 102, FIGS. 8 and 9, advantageously provide excellent surfaces for the connector 16 to be picked up by a vacuum nozzle during manufacturing operations. In this connection, it should also be noted in FIG. 7, that the different profiles of the upper surface 74 and lower surface 76, provide a reference so that robotic assembly equipment can differentiate between the surfaces. Interface 32 includes multiple chamfers 33, FIGS. 2 and 3, which function as lead-in surfaces for mounting connector 16. Similarly, connector 16 includes multiple chamfers 71, FIGS. 6, 8, 9, which also function as lead-in surfaces.

Lateral offsets $d_1$, $d_2$, $d_3$, and $d_4$, described above which relate to keying surfaces 32a, 32b, are incorporated into keying surfaces 74, 76. In addition, the cutaways 46a, 52a of housing surface 32b are keyed to receive flanges 104a, 104b, respectively, of connector surface 76.

In operation, connection end 14c of card 14, FIG. 1, is mounted to contact surfaces 84 of connector 16. The card 14 and connector 16 combination is moved in direction M for inserting card 14 in housing 12. Opposite sides 14a and 14b of card 14 are maintained spaced from walls 18a, 18b of housing 12 by ribs 28a, 28b, respectively, see also FIGS. 2 and 3. As connector 16 moves into engagement with surface 32a, FIGS. 2, 6, and 8, end portions 88a, 88b, slidably engage flanges 36, 42 respectively, tabs 90a, 90b, 94 move into reliefs 34, 40, 38, respectively, latch tabs 78a, 80a move along latch grooves 54, 56, respectively, and lips 38a, 38b engage lips 94a, 94b, respectively. Simultaneously, connector 16 also moves into engagement with surface 32b, see FIGS. 2, 6 and 9. End portions 96a, 96b, slidably engage flanges 46, 52 respectively, tabs 98a, 98b, 102 move into reliefs 44, 50, 48, respectively, flanges 104a, 104b move into cut-aways 46a, 52a, respectively, and lips 102a, 102b engage lips 48a, 48b, respectively. Engagement of the lips as aforesaid interlocks the connector 16 with housing 12 and limits separation of the opposed planar walls 18a, 18b, from the connector 16. Such separation could be stress related or environmentally related causing the planar walls to warp or bow and pull away from connector 16.

Further movement of connector 16, FIGS. 2, 8 and 9, terminates when contoured upper and lower surfaces 32a, 32b of housing 12 are abutted by contoured upper and lower surfaces 74, 76, respectively, of connector 16, whereby tabs 78a, 80a are engaged with tab receiving openings 64, 68, respectively. If tabs 78a, 80a are flexibly attached as discussed above, connector 16 may be easily separated from housing 12 by inserting a suitable tool into openings 64, 68 and flexing the tabs 78a, 80a inwardly toward connector 16. Connector 16 can then be moved out of engagement with housing 12 without damage to connector 16 or card 14, by movement in a direction R, opposite direction M. If tabs 78a, 80a are not flexibly attached as discussed above, connector 16 can still be separated from housing 12 without damage to card 14 by providing, if desired, a frangible portion of housing 12 which can be easily broken away from connector 16 without damaging the connector/circuit assembly.

As it can be seen, there are many advantages to the present invention. One advantage is lower manufacturing cost. The entire one-piece housing is molded for little more cost than a conventional frame, since cycle time rather than material is the larger component of molding costs. Further, the added material used to mold the covers as an integral part of the frame can be partially offset by reducing body side walls thickness in comparison to a discrete frame due to the strength afforded by a monolithic structure. The increase in molding material cost and expense of a more complex mold are small compared to savings gained by elimination of metal cover tooling, stamping and forming. Also, the single piece housing is made in one operation, i.e. molding, providing added savings by doing away with pre-sale secondary operations used to join frame and cover, such as insert molding, adhesive bonding, swaging or snap-fitting.

Another advantage in lower assembly cost. The one-piece card housing and interlocking connector provides reduction of assembly steps and time, lower assembly material usage and reduced parts count. For example, there is no adhesive bonding of covers to a frame, no ultrasonic welding of molded frame halves, no sheet insulator material needed under metal covers to reduce component shorting, no bonding of covers to connector, no need for ground contacts between covers and circuit board and no need for potting compound or filler.

Still another advantage is increased circuit board real estate. Interior body side walls thickness can be reduced in comparison to discrete frame thickness due to the structural strength afforded by single-piece molding. Side wall thickness can be less than insert molded cover/frame subassemblies which have comparatively wide side walls to accommodate overmolding of cover tabs. Thinner side walls of the one-piece body provide more interior room for wider and longer circuit boards. This increased area results in more room for component placement, trace routing and through-hold location.

A further advantage is improved electricals. Dielectric covers, a feature of the device described herein, are known to reduce the incidence of host equipment damage or program execution errors associated with ESD through metal covers. It is also known that EMI emissions from the card, can occur when the metal cover acts an antenna. This antenna effect is reduced by substituting plastic covers, the best attenuation of EMI occurring with use of materials with the highest practical dielectric constant.

A still further advantage is improved mechanicals. Under stress of mechanical or thermal shock, vibration or flexure, card assemblies sometimes fail. Common modes of failure are fracturing of ultrasonic welds and adhesive separation. The one-piece housing avoids these assembly methods and thus the associated failures. Another failure in IC cards is caused by physical shock whereby movement of the circuit assembly away from the connector body occurs, taking the soldered contacts with it. An objective of the device described herein is molding of ribs, circuit board supporting channels and board stops to prevent shifting of the substrate during impact thereby avoiding separation of contacts from the connector body. Another objective is to eliminate the potential for wearing or skiving of the host connector by the typically sharp edges of metal covers. This action produces insulative debris which can enter electrical contact interfaces.

An even further advantage is a reduction in scrap and rework. The device described herein can be designed for ease of disassembly by providing windows in the body for tool actuated unlatching of the connector and withdrawal of the circuit assembly. Where a more tamper-proof assembly is desired, the housing can feature a frangible portion so that it can be easily broken away from the connector without damaging the connector/circuit assembly. Because there are no weld seams to break apart and no adhesive bonded parts or filler as found in presently produced cards, the circuit assembly can be extracted with little danger of damage.

Although illustrative embodiments of the invention have been shown and described, a wide-range of modification, change and substitution is contemplated in the foregoing disclosure and in some instances, some features of the present invention may be employed without a corresponding use of other features. Accordingly, it is appropriate that the appended claims be construed broadly and in a manner consistent with the scope of the invention.

What is claimed is:

1. An IC card package for use with an IC card comprising: a one-piece molded housing, the housing having an open end including an interface defining a plurality of spaced apart keyed first interlock surfaces contoured to include housing reliefs, a connector in snap-fitting engagement therewith, the connector having a mating interface including a plurality of spaced apart second interlock surfaces keyed into oriented engagement with the keyed first interlock surfaces, and means for latching the connector and the housing.

2. The IC card package as defined in claim 1 wherein the housing is molded of a dielectric material.

3. The IC card package as defined in claim 1 wherein the housing defines a cavity therein.

4. The IC card package as defined in claim 3 wherein the housing includes opposed planar surfaces within the cavity, the surfaces including space maintaining ribs connected thereto.

5. An IC card package for use with an IC card comprising: a one-piece molded housing, the housing including means for interlocking a connector in snap-fitting engagement therewith, the means including the connector and housing each having complimentary keyed interfaces which matingly engage in a one-way orientation and each having interacting latch members;

the housing defining a cavity therein and including an open end, the keyed interface of the housing being at the open end; and the open end of the housing including spaced apart housing surfaces, the housing surfaces being contoured to include housing reliefs.

6. The IC card package as defined in claim 5 wherein the housing reliefs of a first one of the spaced apart housing surfaces are off-set relative to the housing reliefs of a second one of the spaced apart housing surfaces.

7. The IC card package as defined in claim 6 wherein the connector includes spaced apart connector surfaces, the connector surfaces being contoured to include connector reliefs.

8. The IC card package as defined in claim 7 wherein the connector reliefs of a first one of the spaced apart connector surfaces are off-set relative to the connector reliefs of a second one of the spaced apart connector surfaces.

9. The IC card package as defined in claim 5 wherein the interacting latch members include a pair of latch tabs on the connector and a pair of latch receivers on the housing.

10. The IC card package as defined in claim 9 wherein the latch tabs are flexibly attached to the connector.

11. An IC card assembly comprising:
a one-piece molded housing having an open end and a cavity formed therein, the open end including an interface having a plurality of first keyed interlock surfaces,
an IC card mounted in the cavity, the card having a first connector surface;
a connector having a second connector surface engaged with the first connector surface, and including a mating interface including second interlock surfaces keyed into oriented engagement with the keyed first interlock surfaces;
means for maintaining spacing between the housing and opposed surfaces of the card; and
means for latching the connector and the housing.

12. The IC card assembly as defined in claim 11 wherein the means for maintaining spacing includes ribs connected to opposed planar surfaces of the housing within the cavity.

13. The IC card assembly as defined in claim 11 wherein the first keyed interlock surfaces include spaced apart housing surfaces, the housing surfaces being contoured to include housing reliefs.

14. The IC card assembly as defined in claim 13 wherein the housing reliefs of a first one of the housing surfaces are laterally off-set relative to the housing reliefs of a second one of the spaced apart housing surfaces.

15. The IC card assembly as defined in claim 14 wherein the second keyed interlock surfaces include spaced apart connector surfaces, the connector surfaces being contoured to include connector reliefs.

16. The IC card assembly as defined in claim 15 wherein the connector reliefs of a first one of the spaced apart connector surfaces are laterally off-set relative to the connector reliefs of a second one of the spaced apart connector surfaces.

17. The IC card assembly as defined in claim 11 wherein the interacting latch members include a pair of latch tabs on the connector and a pair of latch receivers on the housing.

18. The IC card assembly as defined in claim 17 wherein the latch tabs are flexibly attached to the connector.

19. The IC card assembly as defined in claim 11 wherein the means for maintaining spacing includes elongated ribs extending toward the open end of the housing.

20. A method of assembling an IC card package comprising the steps of;
attaching an IC card to a connector having a first keyed interface and a first latch member;
inserting the card and connector into a one-piece housing having an open end including a second keyed interface and a second latch member;
advancing the first keyed interface of the connector into mating engagement with the second keyed interface of the housing; and
urging the first and second keyed interfaces together to interconnect the first and second latch members.

\* \* \* \* \*